(12) United States Patent
White et al.

(10) Patent No.: US 7,808,434 B2
(45) Date of Patent: Oct. 5, 2010

(54) SYSTEMS AND METHODS FOR INTEGRATED ANTENNAE STRUCTURES IN MULTILAYER ORGANIC-BASED PRINTED CIRCUIT DEVICES

(75) Inventors: George E. White, Marietta, GA (US); Sidharth Dalmia, Norcross, GA (US)

(73) Assignee: AVX Corporation, Myrtle Beach, SC (US)

( * ) Notice: Subject to any disclaimer, the term of this patent is extended or adjusted under 35 U.S.C. 154(b) by 525 days.

(21) Appl. No.: 11/836,670

(22) Filed: Aug. 9, 2007

(65) Prior Publication Data
US 2008/0036668 A1 Feb. 14, 2008

Related U.S. Application Data

(60) Provisional application No. 60/821,888, filed on Aug. 9, 2006.

(51) Int. Cl.
*H01Q 1/38* (2006.01)
(52) U.S. Cl. .................. 343/700 MS; 343/895
(58) Field of Classification Search .......... 343/700 MS, 343/895, 846
See application file for complete search history.

(56) References Cited

U.S. PATENT DOCUMENTS

| | | | |
|---|---|---|---|
| 4,745,215 A | 5/1988 | Cox et al. | |
| 4,824,381 A | 4/1989 | Hertzberg et al. | |
| 5,106,461 A | 4/1992 | Volfson et al. | |
| 5,162,257 A | 11/1992 | Yung | |
| 5,247,377 A | 9/1993 | Omeis et al. | |
| 5,270,493 A | 12/1993 | Inoue et al. | |
| 5,323,128 A | 6/1994 | Ishizaki et al. | |
| 5,329,695 A | 7/1994 | Traskos et al. | |
| 5,349,314 A | 9/1994 | Shimizu et al. | |
| 5,373,271 A | 12/1994 | Hirai et al. | |
| 5,384,434 A | 1/1995 | Mandai et al. | |
| 5,396,201 A | 3/1995 | Ishizaki et al. | |
| 5,401,913 A | 3/1995 | Gerber et al. | |
| 5,416,454 A | 5/1995 | McVeety | |
| 5,450,290 A | 9/1995 | Boyko et al. | |

(Continued)

FOREIGN PATENT DOCUMENTS

EP 0510971 B1 10/1992

(Continued)

OTHER PUBLICATIONS

Son, M. H., Low-Cost Realization of ISM Band Pass Filters Using Integrated Combine Structures, 2000.

(Continued)

*Primary Examiner*—HoangAnh T Le
(74) *Attorney, Agent, or Firm*—Dority & Manning, P.A.

(57) ABSTRACT

Embodiments of the invention may provide for a variety of antennae structures, including the following: a) antennae structures printed directly on the sides of the radio frequency (RF) module or integrated passive device (IPD), b) printed antennae structures fabricated on preformed dielectric lids or overmolds, c) antennae structures fabricated as part of the dielectric wiring that constitutes the wireless module, d) antennae structures that are printed directly on the top of the finished RF module, and e) antennae structures printed directly on the dielectric layers adjacent to thin film wiring and embedded passive elements such as filters, diplexers and couplers.

21 Claims, 15 Drawing Sheets

U.S. PATENT DOCUMENTS

| | | |
|---|---|---|
| 5,497,337 A | 3/1996 | Ponnapalli et al. |
| 5,517,751 A | 5/1996 | Bross et al. |
| 5,521,564 A | 5/1996 | Kaneko et al. |
| 5,532,667 A | 7/1996 | Haertling et al. |
| 5,545,916 A | 8/1996 | Koullias |
| 5,559,360 A | 9/1996 | Chiu et al. |
| 5,610,433 A | 3/1997 | Merrill et al. |
| 5,635,892 A | 6/1997 | Ashby et al. |
| 5,654,681 A | 8/1997 | Ishizaki et al. |
| 5,668,511 A | 9/1997 | Furutani et al. |
| 5,679,414 A | 10/1997 | Akashi et al. |
| 5,703,544 A | 12/1997 | Hays, III |
| 5,716,663 A | 2/1998 | Capote et al. |
| 5,719,354 A | 2/1998 | Jester et al. |
| 5,719,539 A | 2/1998 | Ishizaki et al. |
| 5,720,898 A | 2/1998 | Nohira et al. |
| 5,739,193 A | 4/1998 | Walpita et al. |
| 5,770,986 A | 6/1998 | Tonegawa et al. |
| 5,801,100 A | 9/1998 | Lee et al. |
| 5,818,313 A | 10/1998 | Estes et al. |
| 5,844,299 A | 12/1998 | Merrill et al. |
| 5,917,244 A | 6/1999 | Lee et al. |
| 5,955,931 A | 9/1999 | Kaneko et al. |
| 5,999,243 A | 12/1999 | Kameyama et al. |
| 6,005,197 A | 12/1999 | Kola et al. |
| 6,008,102 A | 12/1999 | Alford et al. |
| 6,021,050 A | 2/2000 | Ehman et al. |
| 6,026,286 A | 2/2000 | Long |
| 6,031,727 A | 2/2000 | Duesman et al. |
| 6,040,226 A | 3/2000 | Wojnarowski et al. |
| 6,051,289 A | 4/2000 | Tsujimoto et al. |
| 6,079,100 A | 6/2000 | Farquhar et al. |
| 6,093,599 A | 7/2000 | Lee et al. |
| 6,114,925 A | 9/2000 | Lo |
| 6,127,905 A | 10/2000 | Horie |
| 6,153,290 A | 11/2000 | Sunahara |
| 6,166,799 A | 12/2000 | Kageyama et al. |
| 6,171,716 B1 | 1/2001 | Sasaki et al. |
| 6,177,853 B1 | 1/2001 | Nagatomi et al. |
| 6,181,278 B1 * | 1/2001 | Kakimoto et al. ..... 343/700 MS |
| 6,191,666 B1 | 2/2001 | Sheen |
| 6,191,669 B1 | 2/2001 | Shigemura |
| 6,225,696 B1 | 5/2001 | Hathaway et al. |
| 6,249,962 B1 | 6/2001 | Bergstedt |
| 6,255,714 B1 | 7/2001 | Kossives et al. |
| 6,259,037 B1 | 7/2001 | Feilchenfeld et al. |
| 6,259,148 B1 | 7/2001 | Bartush et al. |
| 6,261,872 B1 | 7/2001 | Hathaway et al. |
| 6,281,430 B1 | 8/2001 | Lupo et al. |
| 6,287,931 B1 | 9/2001 | Chen |
| 6,303,423 B1 | 10/2001 | Lin |
| 6,333,469 B1 | 12/2001 | Inoue et al. |
| 6,380,608 B1 | 4/2002 | Bentley |
| 6,395,374 B1 | 5/2002 | McAndrew et al. |
| 6,421,015 B2 | 7/2002 | Bergstedt |
| 6,445,266 B1 | 9/2002 | Nagatomi et al. |
| 6,492,886 B1 | 12/2002 | Kushitani et al. |
| 6,528,732 B1 | 3/2003 | Okubora et al. |
| 6,559,798 B1 * | 5/2003 | Marumoto et al. .......... 342/372 |
| 6,583,687 B2 | 6/2003 | Nosaka |
| 6,586,686 B1 | 7/2003 | Enomoto et al. |
| 6,625,037 B2 | 9/2003 | Nakatani et al. |
| 6,630,630 B1 | 10/2003 | Maezawa et al. |
| 6,713,162 B2 | 3/2004 | Takaya et al. |
| 6,759,600 B2 | 7/2004 | Koyama et al. |
| 6,900,708 B2 | 5/2005 | White et al. |
| 6,987,307 B2 | 1/2006 | White et al. |
| 2001/0004228 A1 | 6/2001 | Hirai et al. |
| 2001/0016980 A1 | 8/2001 | Bergstedt |
| 2001/0050599 A1 | 12/2001 | Maekawa et al. |
| 2002/0008301 A1 | 1/2002 | Liou et al. |
| 2002/0048930 A1 | 4/2002 | Lin |
| 2002/0064701 A1 | 5/2002 | Hand et al. |
| 2002/0064922 A1 | 5/2002 | Lin |
| 2002/0074158 A1 | 6/2002 | St. Lawrence et al. |
| 2002/0076538 A1 | 6/2002 | St. Lawrence et al. |
| 2002/0081443 A1 | 6/2002 | Connelly et al. |
| 2002/0157864 A1 | 10/2002 | Koyama et al. |
| 2002/0158305 A1 | 10/2002 | Dalmia et al. |
| 2002/0172021 A1 | 11/2002 | Seri et al. |
| 2002/0195270 A1 | 12/2002 | Okubora et al. |
| 2004/0000425 A1 | 1/2004 | White et al. |
| 2004/0000701 A1 | 1/2004 | White et al. |
| 2004/0000968 A1 | 1/2004 | White et al. |
| 2004/0034489 A1 | 2/2004 | Ogino et al. |
| 2004/0113752 A1 | 6/2004 | Schuster |
| 2005/0248418 A1 | 11/2005 | White et al. |
| 2006/0017152 A1 | 1/2006 | White et al. |
| 2006/0092079 A1 * | 5/2006 | de Rochemont ...... 343/700 MS |
| 2007/0257843 A1 * | 11/2007 | Gooshchin ........... 343/700 MS |

FOREIGN PATENT DOCUMENTS

| | | |
|---|---|---|
| EP | 0645952 A1 | 3/1995 |
| EP | 0506476 B1 | 6/1996 |
| EP | 1235235 A1 | 8/2002 |
| EP | 1411553 A1 | 4/2004 |
| JP | 09130103 A2 | 5/1997 |
| WO | 0195679 A1 | 12/2001 |
| WO | 0197582 A1 | 12/2001 |
| WO | 200508490 A2 | 1/2005 |

OTHER PUBLICATIONS

Matijasevic, G., MCM-L Substrates Fabricated Using Patterned TLPS Conductive Composites, 1997, International Conference on Multichip Modules, Apr. 2, 1997, pp. 64-69.

Charles, H.K., Packaging With Multichip Modules, 1992 IEEE/CHMT International Electronics Manufacturing Technology Symposium, pp. 206-210.

Min, S.H., Design, Fabrication, Measurement and Modeling of Embedded Inductors in Laminate Technology, ASME International Electronics Packaging Technical Conference and Exhibition, Jul. 8-13, 2001, pp. 1-5.

Dalmia, S., Modeling RF Passive Circuits Using Coupled Lines and Scalable Models, 2001, Electronic Components and Technology Conference, pp. 816-823.

Kanetaka, T.M., Display from INSPEC, Dec. 4, 2002, www.stneasy.org.tmp.

Loke, A.L.S., Evaluation of Copper Penetration in Low-k Polymer Dielectrics by Bias-Temperature Stress, MRS Spring Meeting, Symposium N/O, Paper O4.4, San Francisco, CA, Apr. 7, 1999.

Wang, A Full-Wave Analysis Model for Uniplanar Circuits with Lumped Elements, IEEE Transactions on Microwave Theory and Techniques, vol. 51, No. 1, Jan. 2003.

Liquid Crystal Polymers for Printed Wiring Boards, www.sbir.gsfc.nasa.gov/SBIR/successes/ss/110text.html.

Flexible Printed Circuit-YFLEX, Patent Abstracts of Japan, vol. 1995, No. 09, Oct. 31, 1995, www.yamaichi.us/yflex.html.

Hong, J.S., Microstrip Filters for RF/Microwave Applications, Wiley-Interscience Publication, 2001, pp. 121-159.

\* cited by examiner

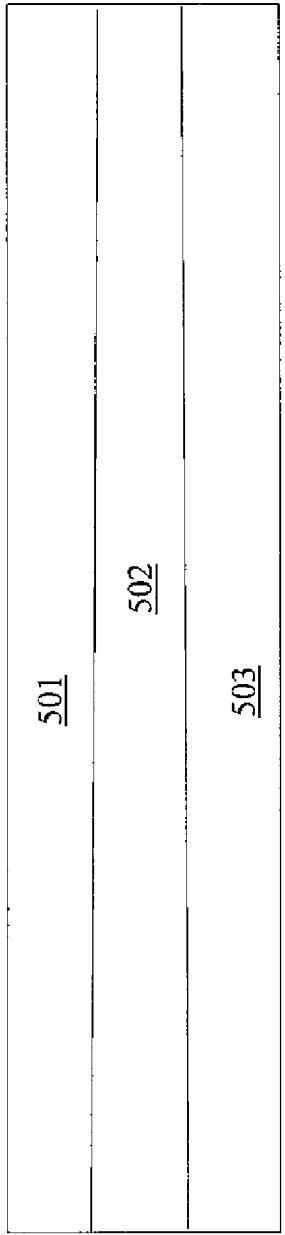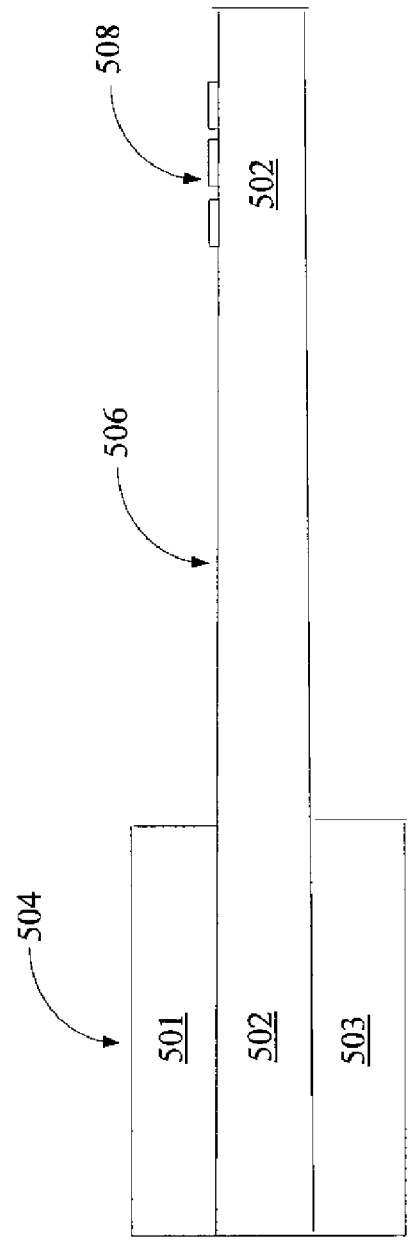
FIG. 5A
FIG. 5B

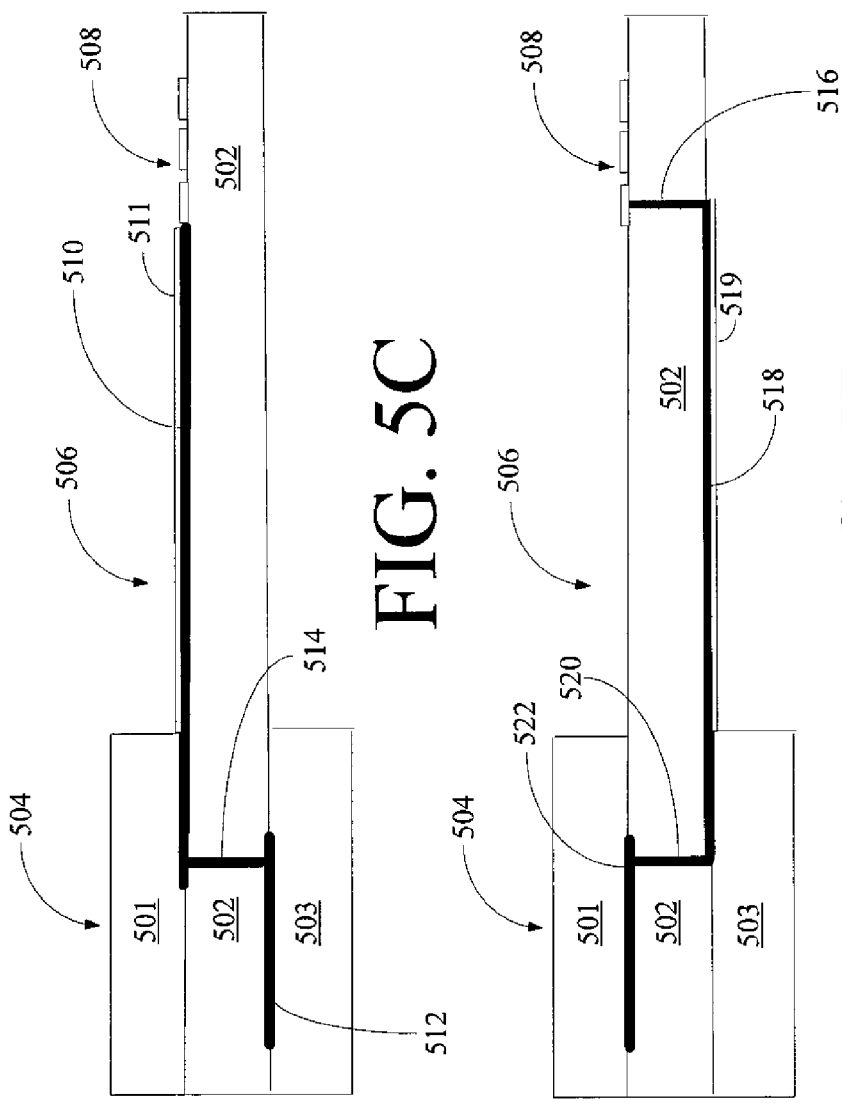

SYSTEMS AND METHODS FOR INTEGRATED ANTENNAE STRUCTURES IN MULTILAYER ORGANIC-BASED PRINTED CIRCUIT DEVICES

RELATED APPLICATIONS

This application claims benefit of U.S. Provisional Application No. 60/821,888, filed Aug. 9, 2006, an entitled "Systems and Methods for Integrated Antennae Structures in Multilayer Organic-Based Printed Circuit Devices. The application is also related to U.S. Pat. No. 6,900,708, filed on Mar. 28, 2003 as application Ser. No. 10/402,315, and entitled "Integrated Passive Devices Fabricated Utilizing Multilayer Organic Laminates;" U.S. Pat. No. 7,068,124, filed on May 27, 2005 as application Ser. No. 11/140,630, and entitled "Integrated Passive Devices Fabricated Utilizing Multilayer Organic Laminates;" U.S. application Ser. No. 10/402,315, filed on Mar. 28, 2003, and entitled "Methods for fabricating three-dimensional all organic interconnect structures;" and application Ser. No. 11/177,508, filed Jul. 8, 2005, and entitled "Heterogeneous Organic Laminate Stack Ups for High Frequency Applications." All of the foregoing applications are incorporated by reference in their entirety.

BACKGROUND OF THE INVENTION

I. Field of the Invention

Embodiments of the invention relate generally to antennae structures, and more particularly to embedded and/or integrated antennae structures on multilayer organic and inorganic substrates for use in compact systems and subsystems such as laptops and hand held wireless applications.

II. Related Art

There are at least three major challenges for antenna design associated with wireless integration into portable handheld, mobile and laptop applications. First, many of these applications are very densely packed electronic devices, and leave very little room for additional functions. Second, FCC emission requirements have forced laptop manufacturers and other portable electronics suppliers to make extensive use of conducting materials in the covers of the laptops or conducting shields to minimize radiation from today's very high-speed processors. Thus, it is difficult to place an antenna in an environment free enough of other conductors to create an efficient radiator. Third, the size, shape, and location of the antenna may be affected by other design constraints such as the mechanical and industrial design. Therefore, it is currently necessary to make engineering tradeoffs between the design, performance, and placement of the antenna on the one hand (given the industrial and mechanical design) versus the size of the system or subsystem on the other.

As an example, early results based strictly on analytical modeling, blind cut-and-try, or the use of "integratable" vendor solutions yielded an integrated Bluetooth antenna solution incapable of reliable connectivity much beyond 1-3 meters, which was not even close to the advertised Bluetooth specification of 10 meters. Surprisingly, vendor solutions that touted fully integrated design capability for Bluetooth appeared to be using measurements of freestanding antennas. Once integrated with the odd ground planes and cabling of a real system, the antennas fell far short of advertised performance. Selling an integrated system solution that falls short of user expectations creates disappointment and dissatisfaction in the marketplace and therefore jeopardizes broad acceptance of wireless technology.

BRIEF SUMMARY OF THE INVENTION

Embodiments of the invention may provide for a variety of antennae structures, including the following: a) antennae structures printed directly on the sides of the radio frequency (RF) module or integrated passive device (IPD) and fed using a number of interconnect schemes including, but not limited to, ball grid array (BGA), land grid array (LGA), pin grid array (PGA), and plated through hole (PTH), b) printed antennae structures fabricated on preformed dielectric lids or overmolds and electrically fed via conductive standoffs and metal traces, c) antennae structures fabricated as part of the dielectric wiring that constitutes the wireless module and electrically fed using a flexible interconnection, where the flexible interconnect utilizes a coverlayer typical of what is defined as a rigid flex board or using a connection (e.g., a TAB connection) between the module and antenna structure, d) antennae structures that are printed directly on the top of the finished RF module whereas the antenna is fed electrically via an edge connection or metal standoff and c) antennae structures printed directly on the dielectric layers adjacent to thin film wiring and embedded passive elements such as filters, diplexers and couplers.

According to an embodiment of the invention, there is a system for an organic antenna structure. The system may include a first organic layer having a first portion and a second portion, the first portion including a first conductive layer that is patterned to form at least one passive device and a second portion including a second conductive layer that is patterned to form one or more interconnect traces, where the first conductive layer and the second conductive layer are electrically connected, a second organic layer positioned over the first portion of the first organic layer, where the second organic layer and the first portion of the first organic layer sandwich the first conductive layer, and an antenna structure, where the antenna structure is electrically connected to one or more interconnect traces of the second conductive layer.

According to another embodiment of the invention, there is a system for organic antenna structures. The system may include a multilayer organic stackup, where the stackup may include a first organic layer having a conductive layer, wherein the conductive layer is patterned to form at least one passive device, and a second organic layer positioned opposite the first organic layer, where the first and second organic layers sandwich the patterned conductive layer. The system may also include an antennae structure distinct from the multilayer stackup, and a flexible organic interconnect that electrically connects at least a portion of the conductive layer of the multilayer organic stackup and the antenna structure.

According to yet another embodiment of the invention, there is a multilayer stackup. The multilayer stackup may include a first organic layer having a first conductive layer adjacent to a first surface and a second conductive layer adjacent to a second surface opposite the first surface, where the first and second conductive layers are patterned to form at least one passive device and first parallel sections of an antennae structure, a second organic layer positioned opposite the first surface of the first organic layer, a third organic layer positioned opposite the second surface of the first organic layer, where the second and third organic layers sandwich the first organic layer, and at least one first via originating at the first conductive layer and terminating at the second layer to electrically connect the first parallel sections of the antenna structure.

BRIEF DESCRIPTION OF THE FIGURES

Figure 1:
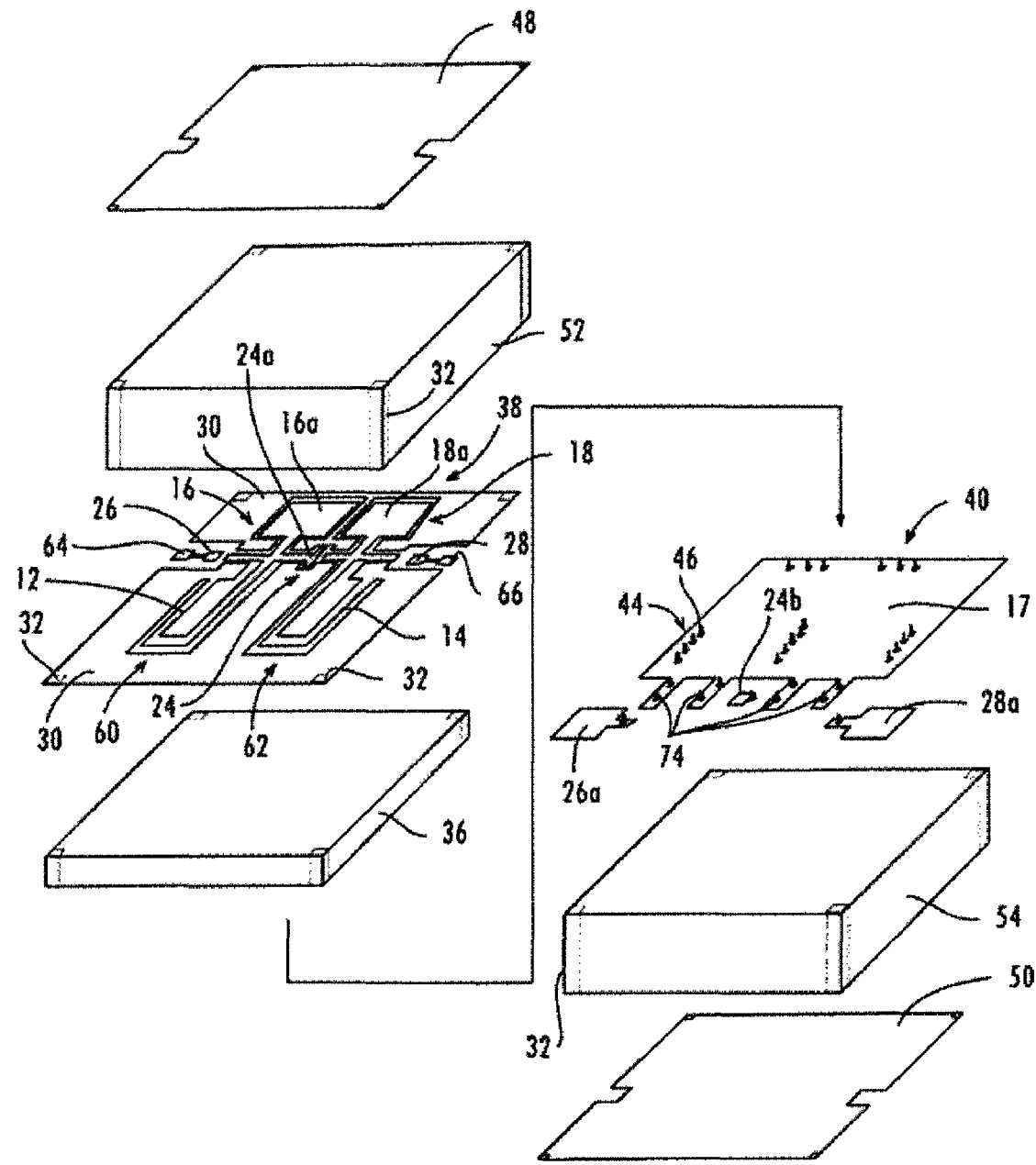

Having thus described the invention in general terms, reference will now be made to the accompanying drawings, which are not necessarily drawn to scale, and wherein:

FIG. 1 illustrates a multilayer organic stackup that may be utilized with the antennae structures, according to example embodiments of the invention.

Figure 2A:
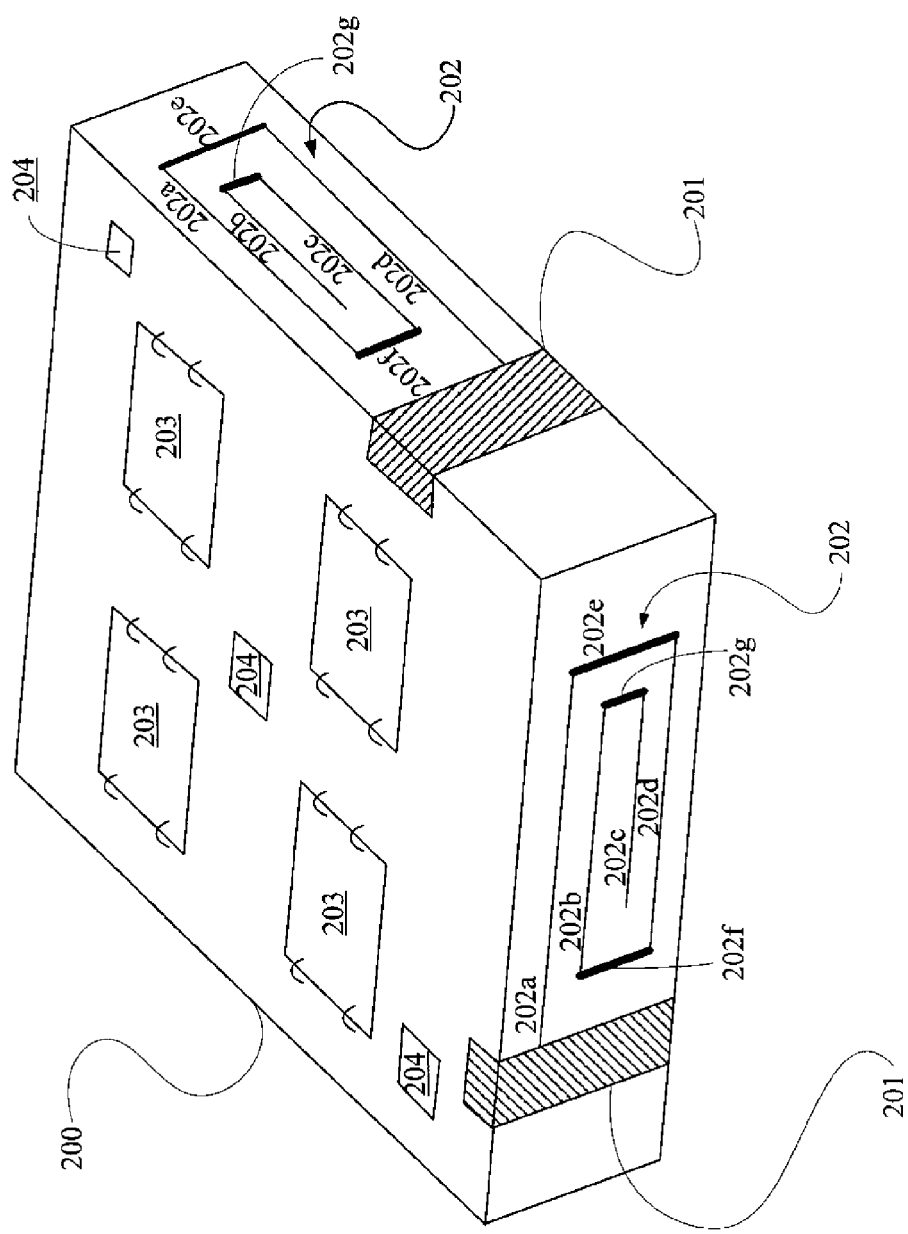

FIG. 2A illustrates a perspective view of a multilayer substrate 200 in accordance with an example embodiment of the invention.

Figure 2B:
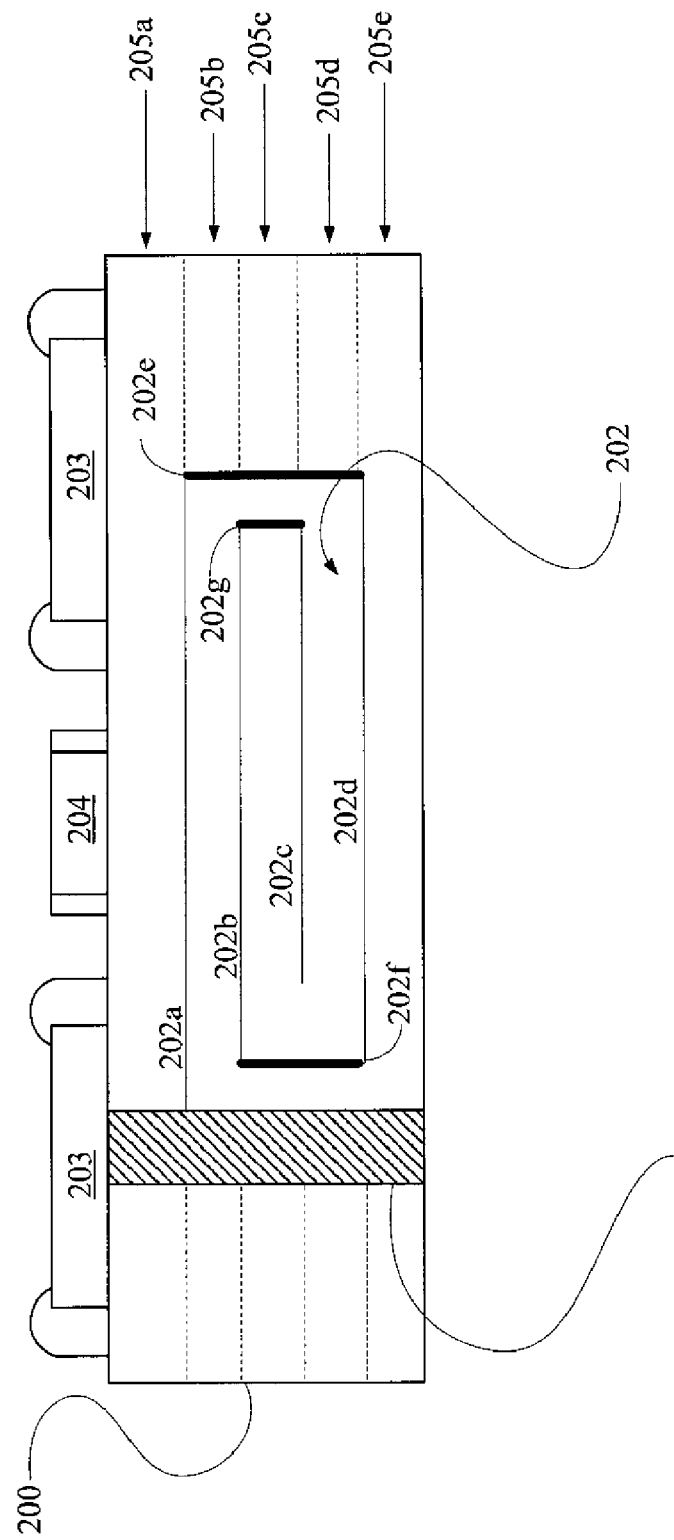

FIG. 2B illustrates a front view of the multilayer substrate of FIG. 2A, according to an example embodiment of the invention.

Figure 3A:
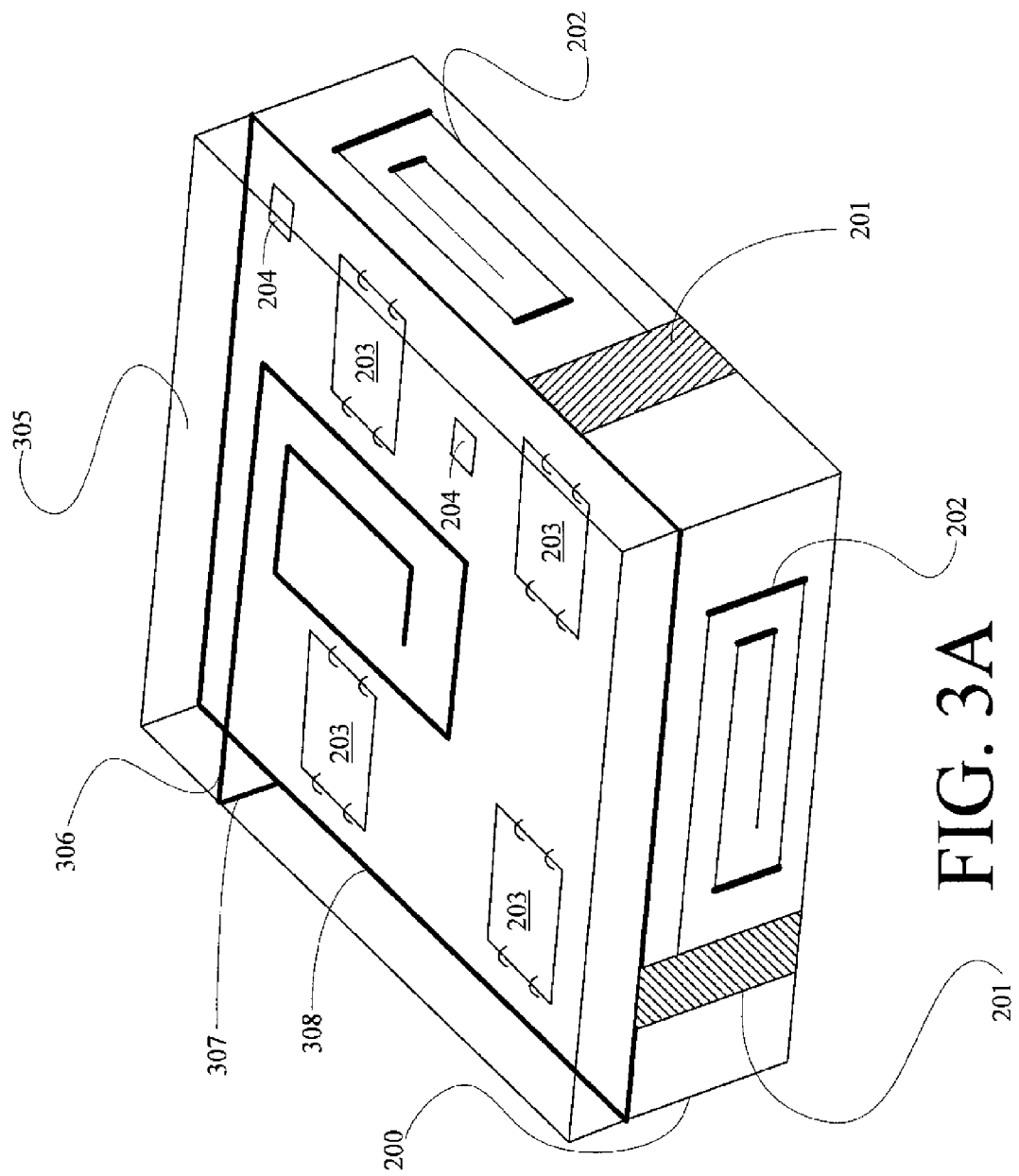

FIG. 3A illustrates a perspective view of an encapsulated module, according to an example embodiment of the invention.

Figure 3B:
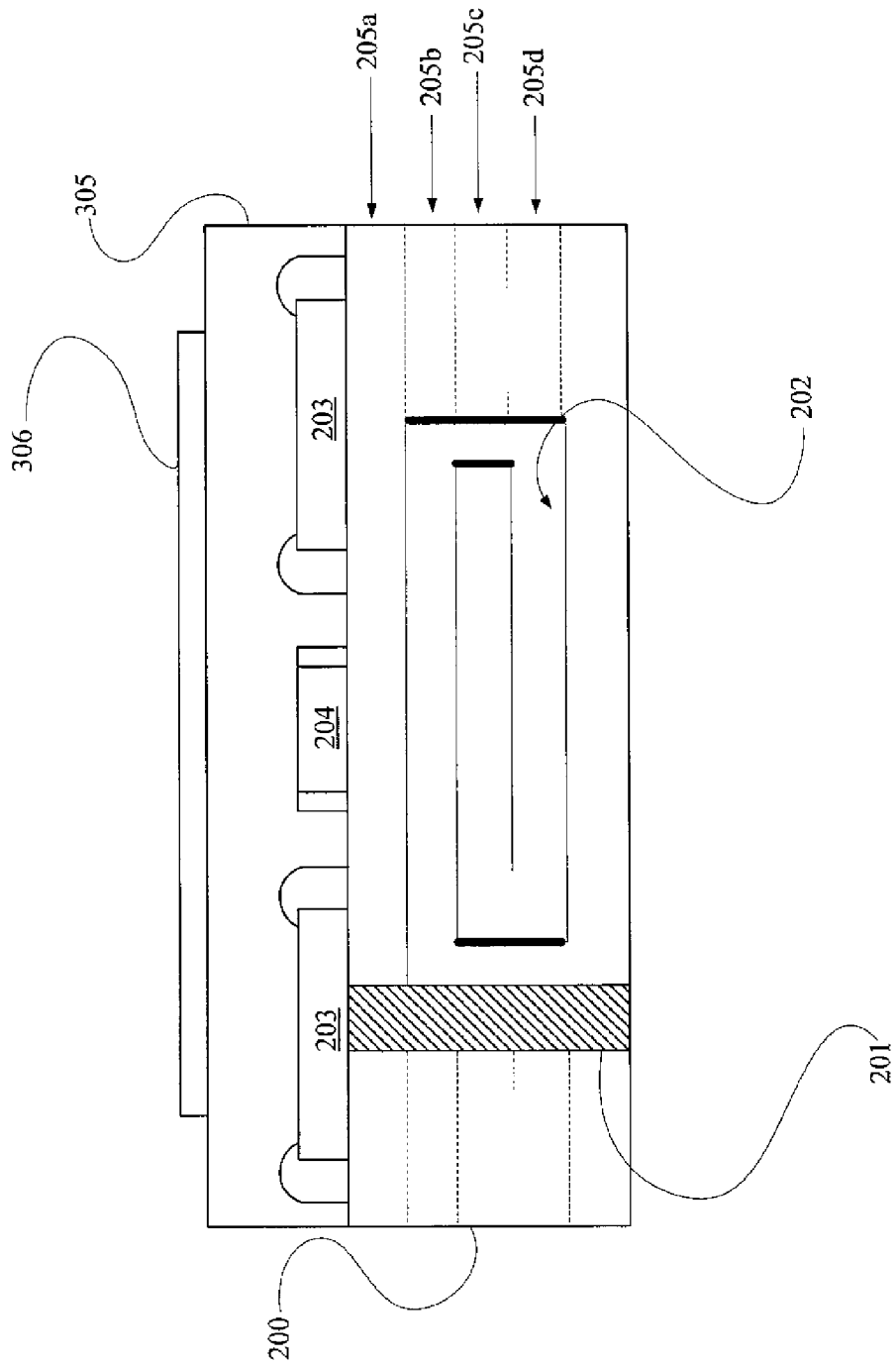

FIG. 3B illustrates a cross-sectional view of the an encapsulated module of FIG. 3A, according to an example embodiment of the invention.

Figure 4A:
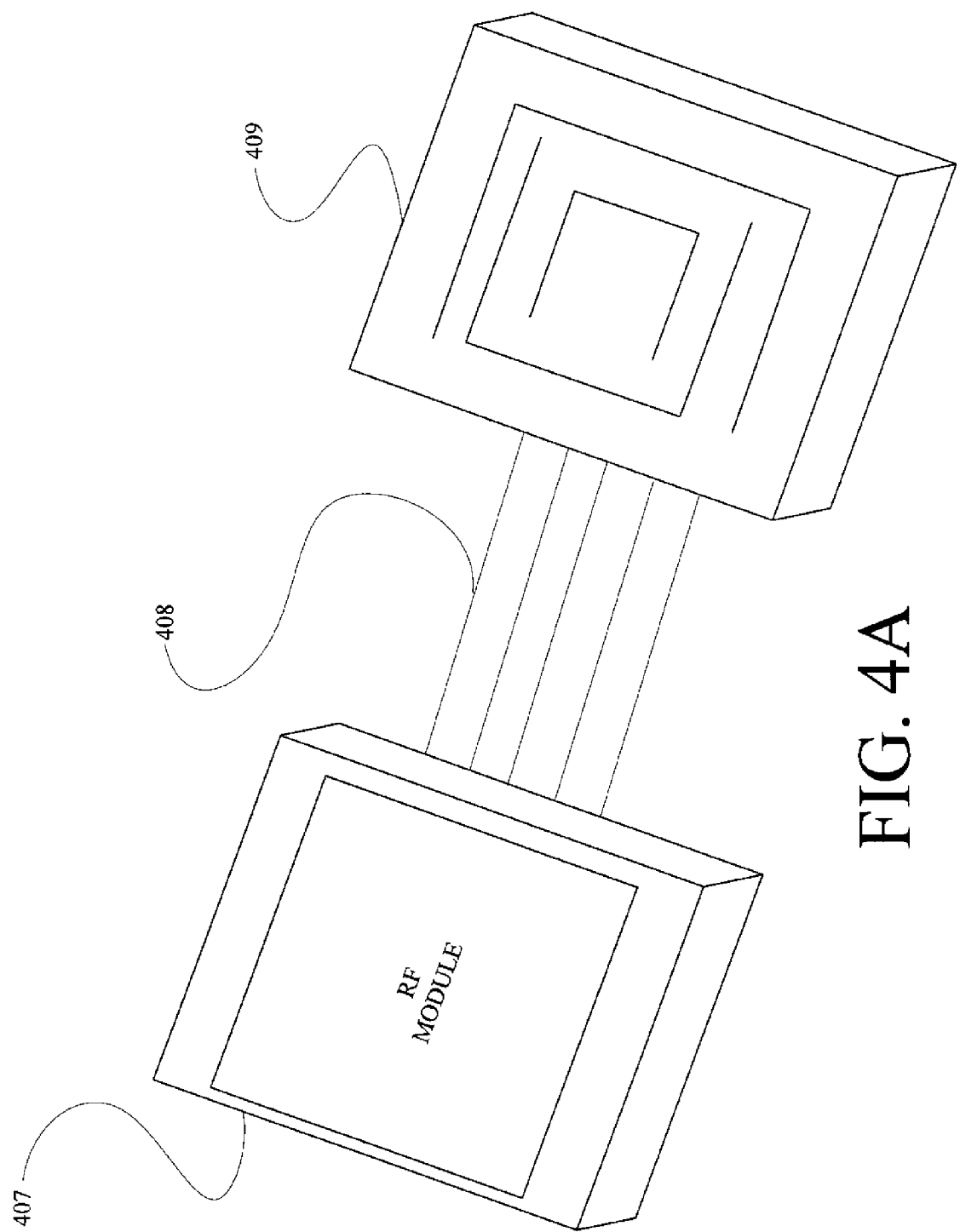

FIG. 4A illustrates a general overview of an RF module in communication with an antenna structure using a flexible interconnect, according to an example embodiment of the invention.

Figure 4B:
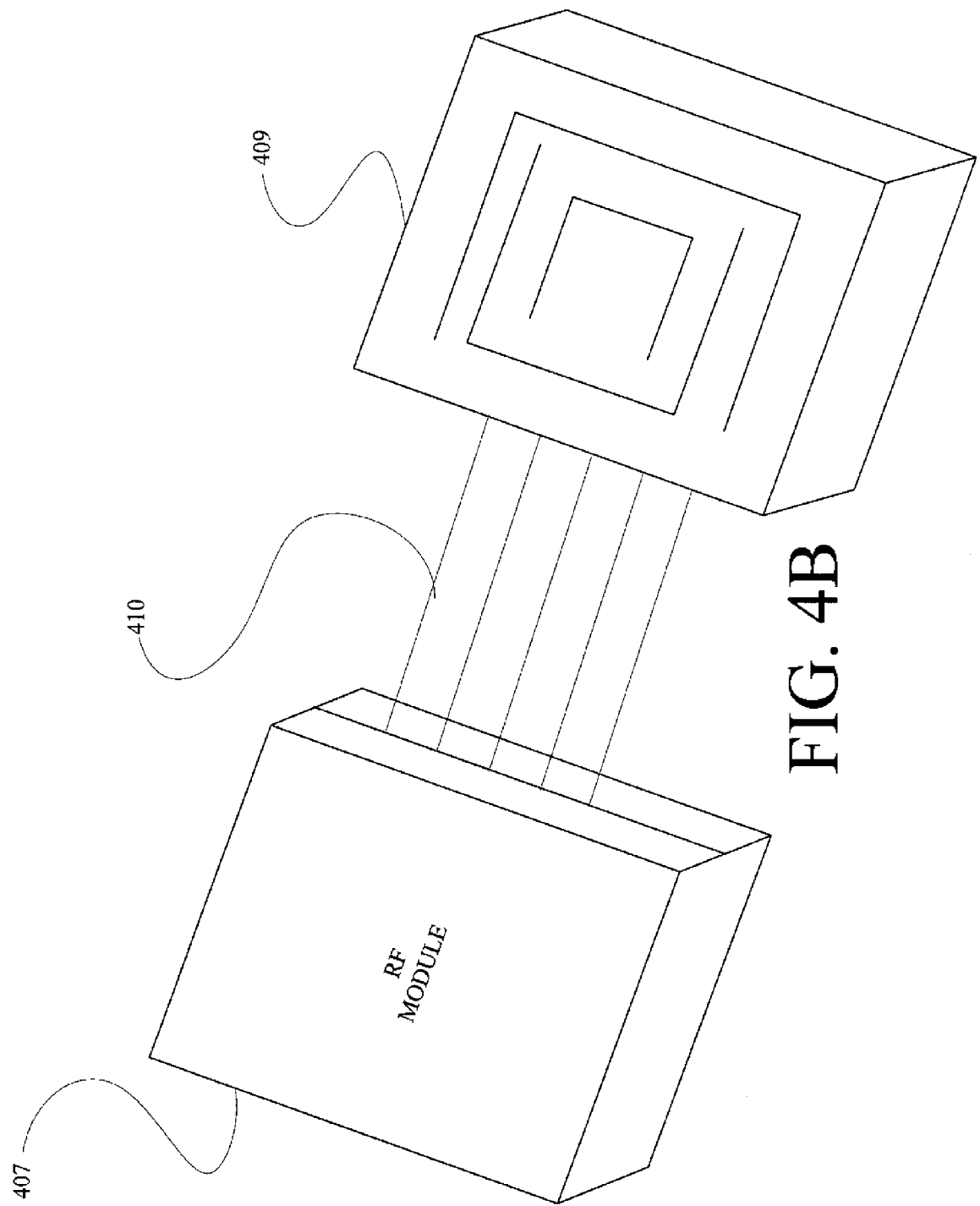

FIG. 4B illustrates an embodiment of the invention where a flexible interconnect connecting an RF module and an antenna module is fabricated as part of the actual circuitry of the RF module, according to an example embodiment of the invention.

Figure 4C:
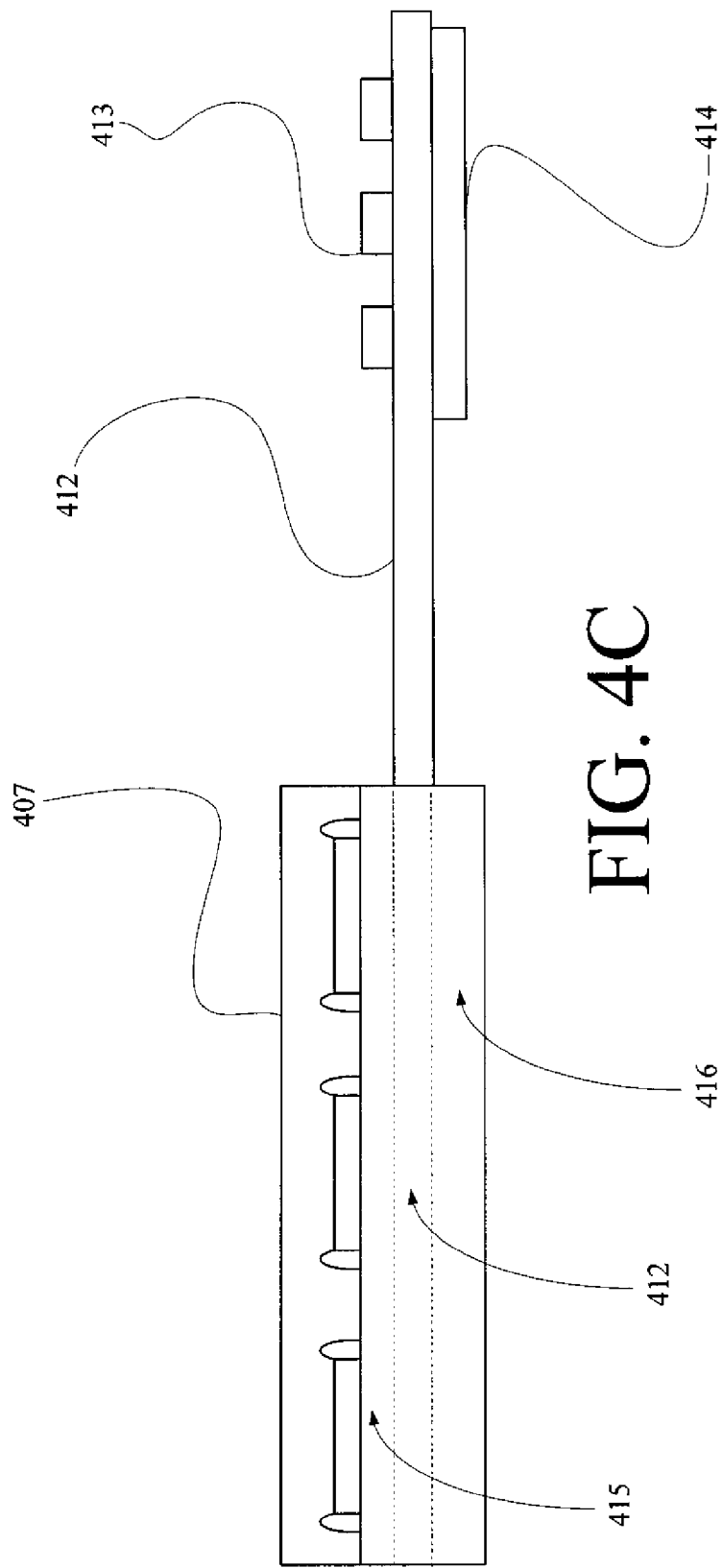

FIG. 4C illustrates an example embodiment of the invention where the flexible interconnect is the substrate upon which the actual antenna structure is fabricated, according to an example embodiment of the invention.

Figure 4D:
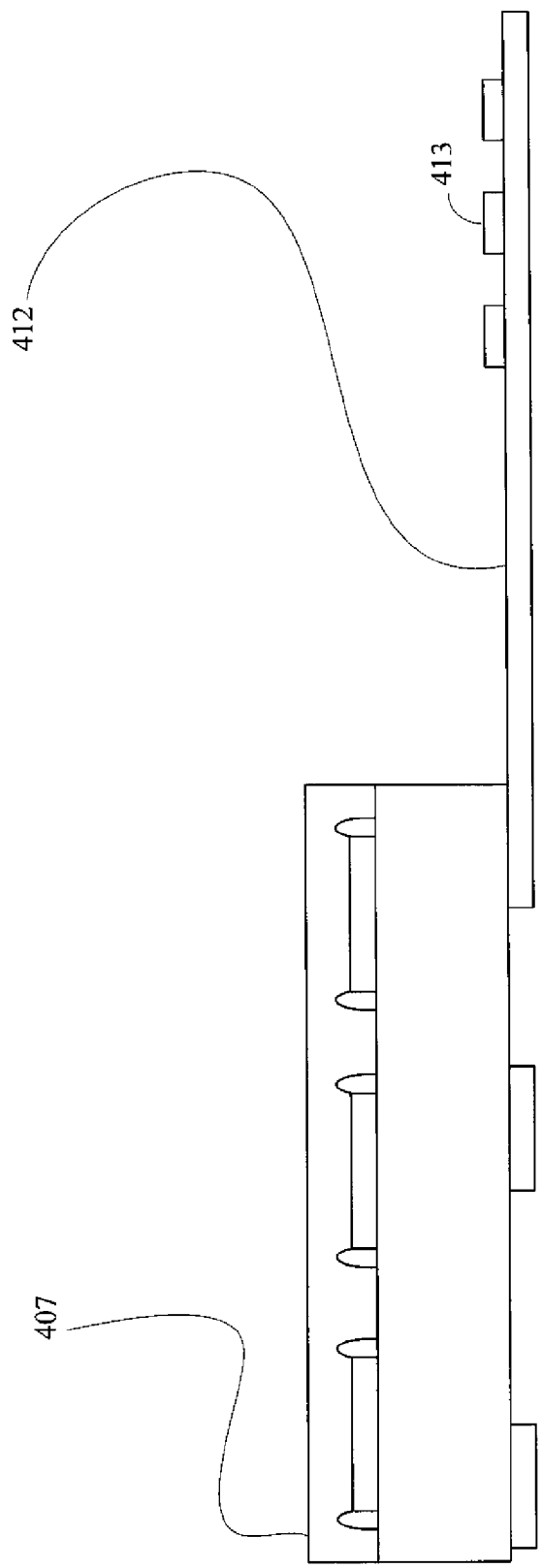

FIG. 4D illustrates an example embodiment of the invention in which a flexible interconnect can be electrically connected to the bottom of the RF module.

Figure 4E:
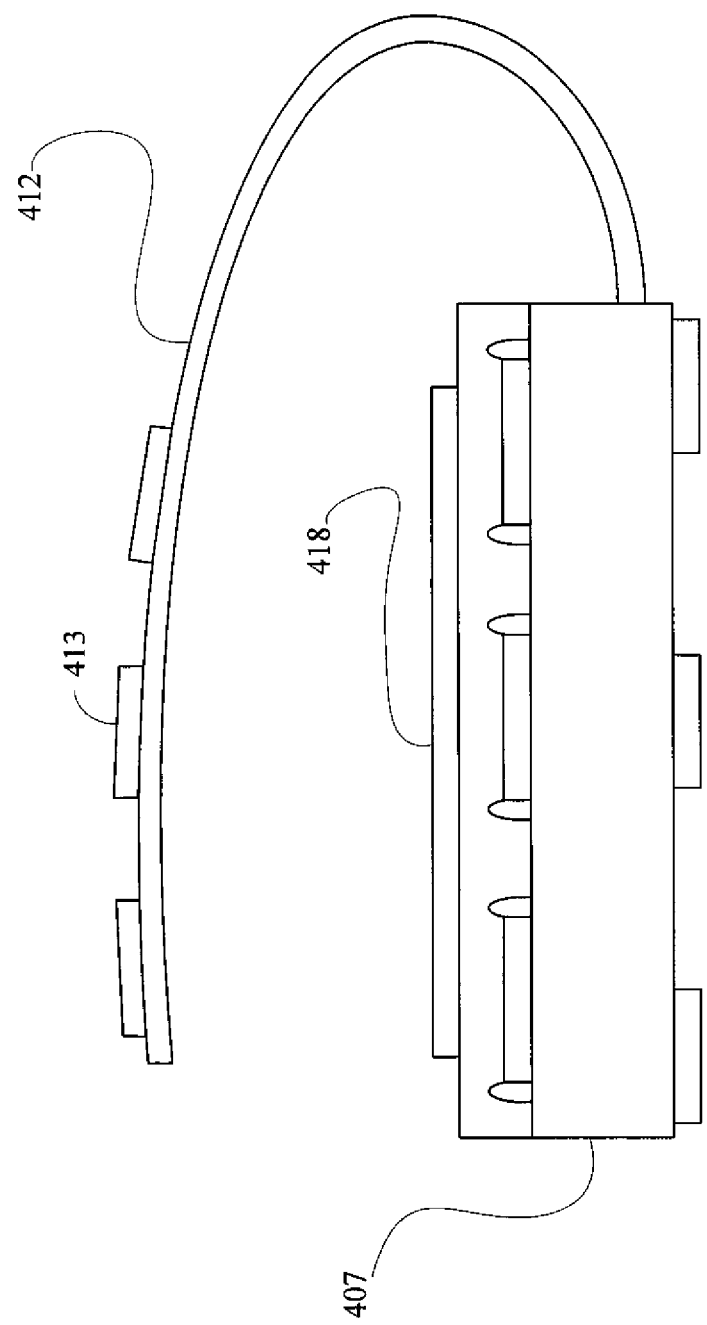
Figure 4F:
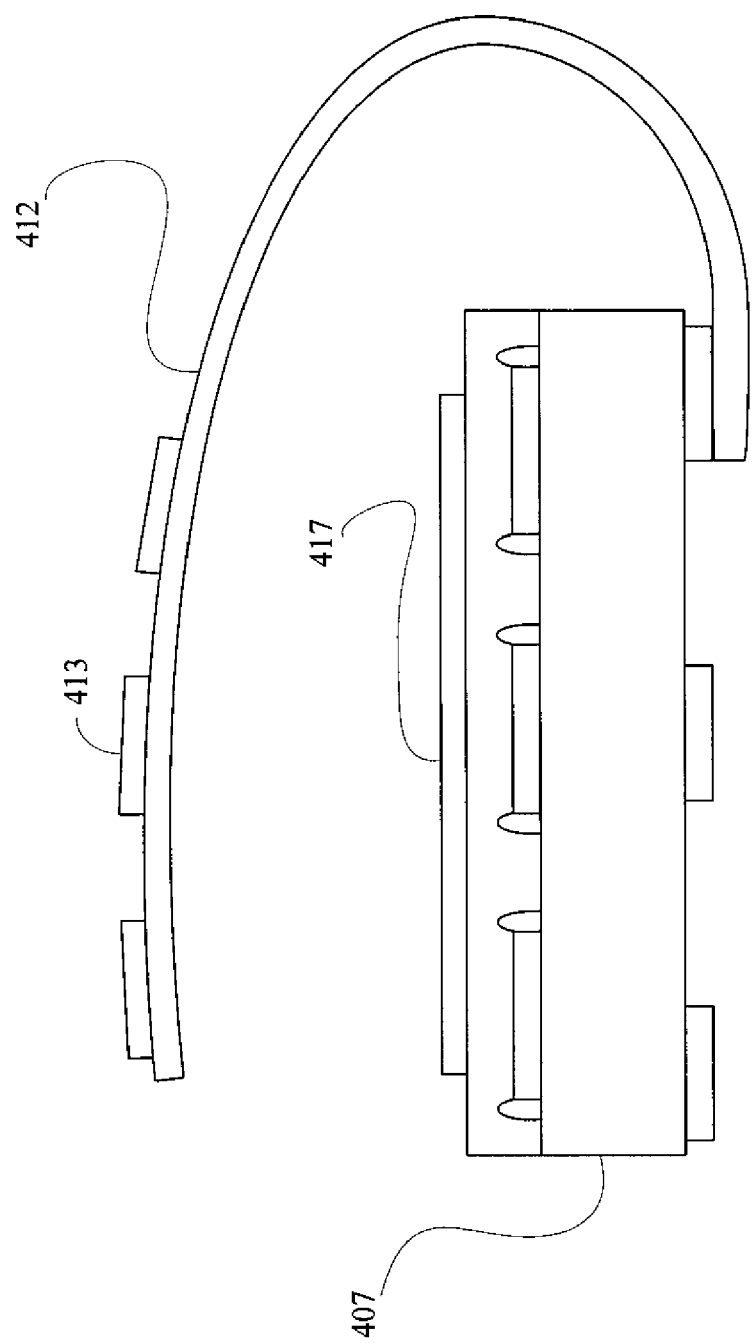

FIGS. 4E and 4F illustrate example embodiments of the invention where a length of the flexible interconnect may be adjusted in order to achieve the desired separation distance between the antenna structure and the ground reference plane.

Figure 4G:
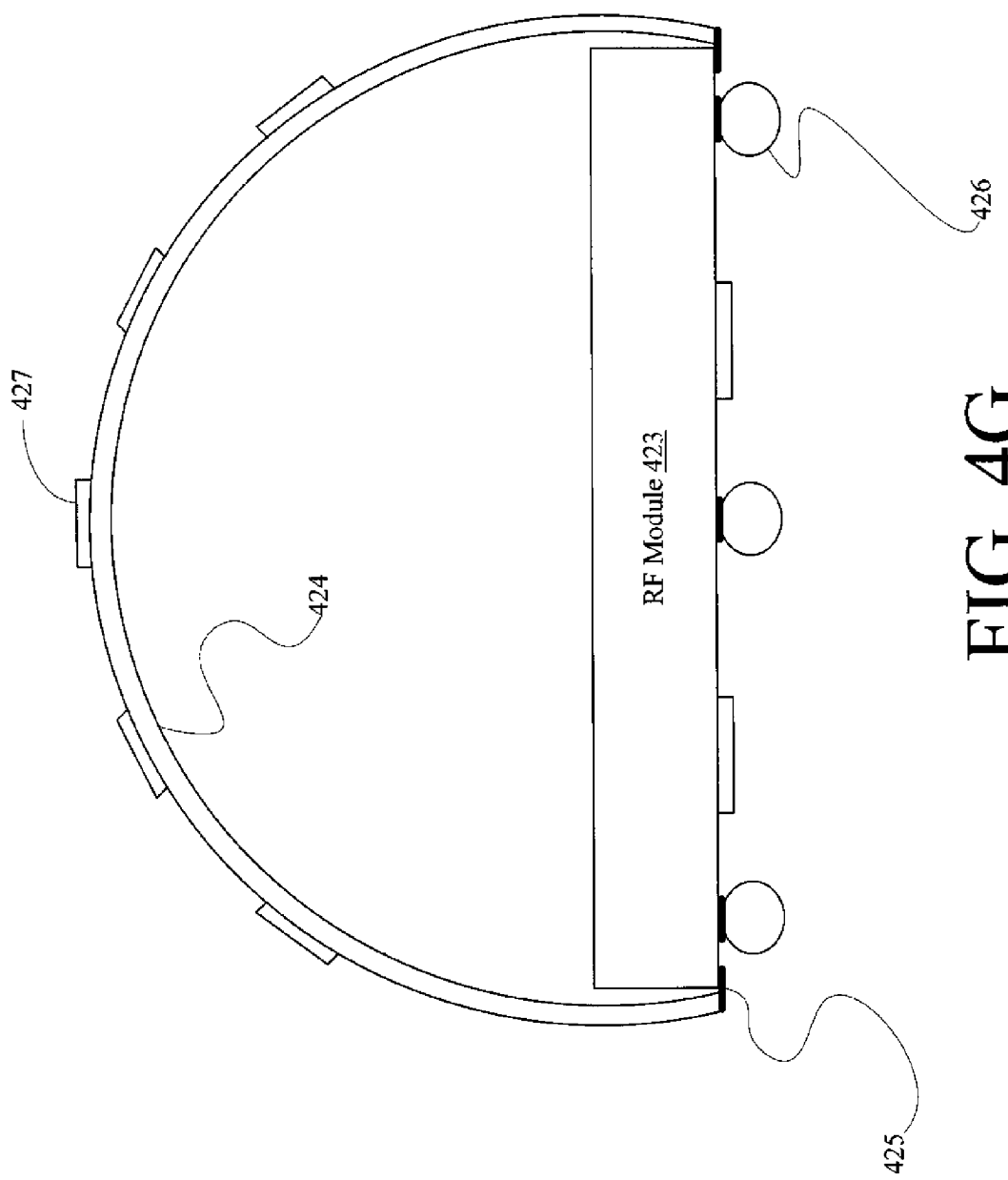

FIG. 4G illustrates an example embodiment of the invention where a flexible interconnect may be used to form a canopy structure over the RF module in a similar fashion as to a TAB connection.

FIGS. 5A and 5B illustrate an example embodiment of a process for fabricating a flexible interconnect, according to an example embodiment of the invention.

FIGS. 5C and 5D illustrate example embodiments of providing electrical connections between an antenna structure and a RF module 504 using a flexible interconnect.

Figure 6:
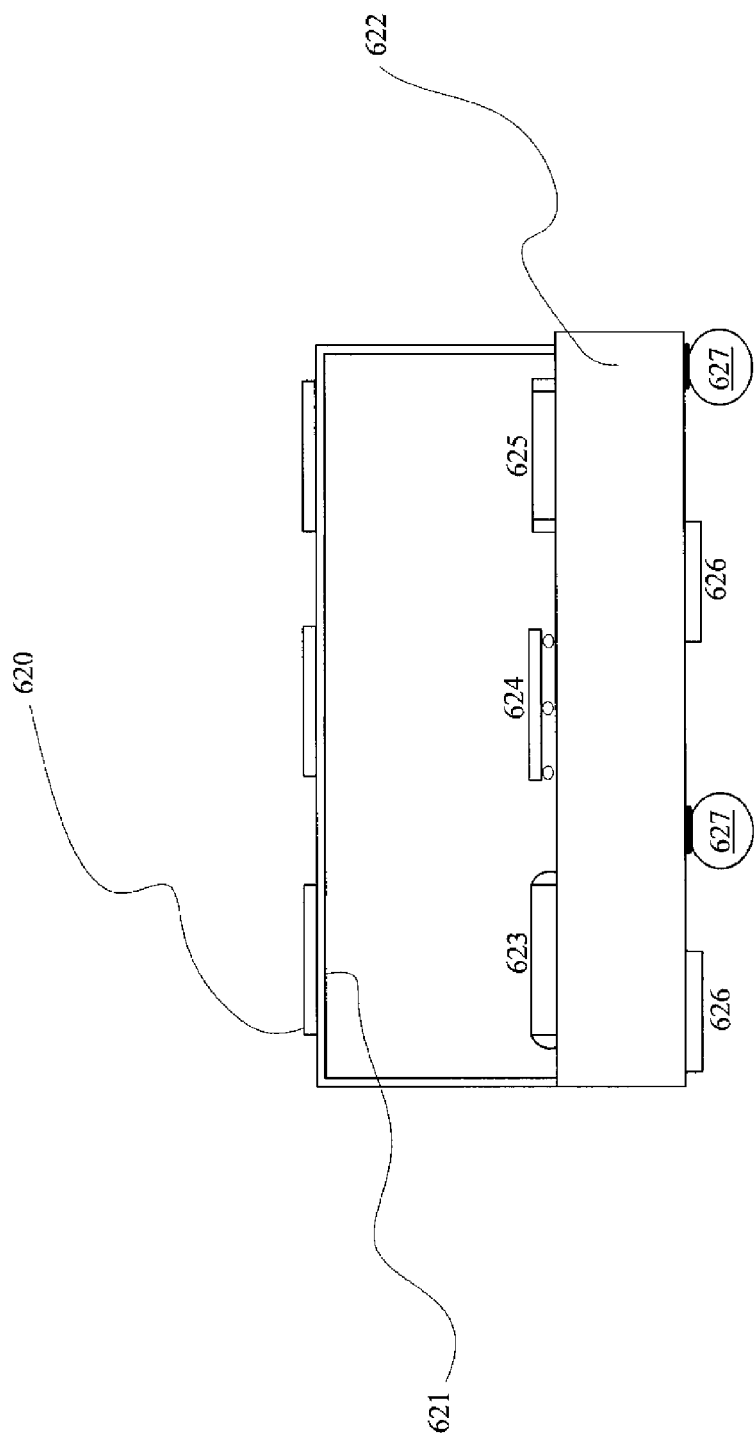

FIG. 6 illustrates an antennae structure that is printed on a preformed dielectric cap or lid, according to an example embodiment of the invention.

DETAILED DESCRIPTION OF THE INVENTION

The present inventions now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Embodiments of the present invention may provide for antennae structures that may be formed as a part of a multilayer organic stackup or otherwise connected to a multilayer organic stackup. According to an embodiment of the invention, the antennae structures described herein may be either fabricated as a part of or otherwise connected to integrated organic substrates or integrated passive devices (IPDs), as described in U.S. Pat. Nos. 6,900,708, and 7,068,124 and U.S. patent application Ser. Nos. 10/402,315 and 11/177,508, which are hereby incorporated by reference. Therefore, embodiments of the present invention may achieve printed one or more antennae structures on an appropriate dielectric organic material, including thermoplastic or thermoset materials, including Rogers 4350 or Rogers 4003, liquid crystalline polymer (LCP), polyphenyl ether (PPE), hydrocarbon, Teflon, epoxy, polyamide, polyimide, and acryllate. Other appropriate dielectric material may be described in U.S. Pat. Nos. 6,900,708, and 7,068,124 and U.S. patent application Ser. Nos. 10/402,315 and 11/177,508.

I. Multilayer Stackup.

FIG. 1 illustrates a multilayer organic stackup that may be utilized with the antennae structures described herein. In particular, the antennae structures may be fabricated on one or more organic layers, which may be embedded within a multilayer organic stackup or otherwise electrically connected to the multilayer organic stackup. While FIG. 1 is provided as an illustrative example of a multilayer organic stackup, it will be appreciated that other embodiments of the invention may include different numbers of organic layers and/or different numbers and types of components. According to an embodiment of the invention, the multilayer organic stackup may form a module, perhaps a radio frequency (RF) module, used for wireless communications.

With reference to FIG. 1, the multilayer organic stackup in accordance with an embodiment of the invention may include inductors 12 and 14, which are meandering inductors formed close to each other on an organic dielectric layer 36 (which can be a thin laminate such as LCP or PPE, but is not limited to these) and may be configured as either a shorted hybrid CPW-stripline (where lines that form meandering inductors 12 and 14 are connected to a coplanar ground, that is, in-built shielding 30), or a stripline in the presence of coplanar in-built shielding 30 and additional grounds in metallization/conductive layers 48 and 50 that are connected to the plated through holes 32 (e.g., vias) and/or external shield electrodes 34.

Since these inductors 12 and 14 are very close to each other, the magnetic coupling between these resulting filters can increase the pass bandwidth, thereby decreasing its performance. However, an inter-resonator parallel plate coupling capacitor 24, (with or without the coplanar in-built shielding 30) formed using two disconnected metal plates (one plate formed using patterning conductive layer 38 and the other plate formed using patterned conductive layer 40) and shown as capacitor plates 24a, 24b is provided. The capacitor plates 24a, 24b may sandwich the first organic dielectric layer 36 in such a manner that each plate of the inter-resonator coupling capacitor electrode may be connected to separate resonators which helps compensate the effect of the magnetic coupling and helps make very compact filters. The center capacitance can be as small as femptoFarads or as large as picoFarads for achieving the specified bandwidths. The smaller capacitance helps reduce the bandwidth. Additionally, capacitor 24 in parallel with the mutual inductance equivalent gives a pole in the lower band or upper band.

The bottom plate formed by the conductive layer 40 connects to inductor 12 using one or more microvias in the organic dielectric layer 36, such as the vias 44 with pads 46 for landing and capturing the via. First and second metallization/conductive layers 48, 50, which may operate at least in part as shield electrodes, are formed respectively on the organic layers 52, 54, where the organic layers 52 and 54 are disposed so as to sandwich the organic dielectric layer 36 there between. A first resonator 60 formed by inductor 12 and capacitor 16 and a second resonator 62 formed by inductor 14 and capacitor 18 are electrically coupled to each other through the parallel plate capacitor 24, whereby an interresonator coupling is effected in combination with said magnetic coupling and electric coupling.

It will be appreciated that where the inductors do not provide the needed capacitance in the desired length, the inductors 12, 14 can be connected in similar fashion as the capacitor 24 to separate grounded/shunted parallel plates 16a and 18a, respectively, of capacitors 16 and 18, respectively, using the same first organic dielectric layer 36 as the sandwiched dielectric, which then together form the resonator pairs 60, 62.

The capacitor plates 16a and 18a have a corresponding ground plate 17 on the opposite surface of the organic dielectric layer 36. Having a common plate does cause coupling between the capacitors which has to be accounted for during the design by including it as the mutual inductance between the parasitic inductance of each capacitor 16, 18. This coupling can be used to achieve further poles; however if the coupling causes problems in the passband during the synthesis stage it could be reduced by either dividing plate 17 into separate plates or by adding several vias on pads 74 that connect plate 17 to in-built shielding 30 on the side of the inductors 12 and 14, thereby helping excess currents to sink and thereby reducing coupling between components.

In addition, parallel plate/interdigital capacitors 26 and 28, can be used on either side of the first and last resonator elements 60, 62 at the input and output terminals of the device for impedance matching purposes. Alternatively, inductors or transmission lines or a combination of capacitor(s), inductor (s) and transmission line(s) can be utilized, as desired. If capacitors 26, 28 are used for matching purposes, it follows the center capacitance is that of capacitor 24 in terms of the nominal capacitances required, that is, the capacitance from capacitor 26 and capacitor 28 are proportional to capacitor 24.

Still referring to FIG. 1, the multilayer stackup also comprises an input terminal electrode 64 and an output terminal electrode 66 which are formed on one side surface of a laminated body comprising at least dielectric sheets 52, 36, 54, and an external ground electrode, (such as provided by at least a portion of metallization/conductive layers 48, 50, through holes 32 or side shield electrodes 34) formed between the input and output terminal electrodes 64, 66 on one side surface.

The first organic dielectric layer 36 can comprise single side copper LCP laminate or the like, such as PPE, N6000, epoxy based N4000-13, or any other suitable low loss dielectric. In the multilayer stackup of FIG. 1, an initial step to making a connection between devices using vias 44 is done by drilling through holes (as small in diameters as the thickness of the dielectric used) through the LCP layer (or any other appropriate organic dielectric) and copper layer. Then both sides of LCP copper laminate may metallized, such as by electroless or vacuum deposited copper. Copper is then electroplated on both sides of laminate to form the metallized patterns 38, 40 on the organic dielectric layer 36. The copper is then printed and etched to define the desired components.

In FIG. 1, the dielectric layers 52, 54 can be laminate LCP or appropriate dielectric with generally larger thickness than the first substrate and aluminum, copper, Molybenum metal (for high power applications) on both sides of filter to a given thickness to encapsulate components. All metals are may be electroplated, etched, and patterned on top and bottom of the device to leave space for signal input and output.

It will be appreciated that one or both of the metallization/ conductive layers 48 and 50 in FIG. 1 may be patterned. The metallization/conductive layers 48 and 50, and other metallization/conductive layers described herein, may be formed of a variety of metals or conductive materials, including copper, gold, silver, nickel, and the like. According to an example embodiment of the invention, one or both of the metallization/ conductive layers 48 and 50 may be patterned in order to accommodate devices such as flip-chip, wafer level packages (WLP), chip scale packages (CSP), ball grid array (BGA), wire bonded devices and various surface mount devices (SMD or SMT). Furthermore, while not illustrated in FIG. 1, one or more vias may be provided from metallization/conductive layers 48 and 50 to provide electrical connections to internal metallization/conductive layers (e.g., conductive layers 38 and 40).

While one embodiment of a multilayer organic stackup has been illustrated in FIG. 1, it will be appreciated that other embodiments of the multilayer organic stackup are available. For example, embodiments of the present invention may utilize multilayer printed-circuit board (PCB) type structures, as described in U.S. Pat. Nos. 6,900,708, and 7,068,124 and U.S. patent application Ser. Nos. 10/402,315 and 11/177,508, which may allow for the realization of truly integrated and embedded antennae structures that may be compact and fully shielded with a high SWR (Standing Wave Ratio) independent of the type of antennae structure that is used (e.g., INF, slot, patch, dipole, monopole, chip, meander, etc). Indeed, many variations of the multilayer organic stacks are available.

II. Antennae Structures

As described above, antennae structures in accordance with embodiments of the invention. may be fabricated on one or more organic layers, which may be embedded within a multilayer organic stackup or otherwise electrically connected to the multilayer organic stackup. Accordingly, the integration of antennae structures onto one or more organic layers may yield one or more of the following: (i) accommodation of a variety of different forms of antennae structures, (ii) compact structures due to the ability to simultaneously print the antenna structure and the interconnects that feed the antenna structure using the same process, (iii) improved isolation due to the ability to utilize various dielectric material onto which the antennae structures can be built, (iv) improved performance due to the ability to manipulate ground references, (v) conformal antennae structures for improved performance and gain, (vi) connectivity and reconfigurability by direct connection to switch elements which control spatial diversity and band switch.

In accordance with example embodiments of the invention, the antennae structures may be realized in a variety of ways including: (A) antennae structures provided on one or more sides of a multilayer organic stackup (e.g., an RF module or Integrated Passive Device (IPD)), (B) antennae structures printed directly on the top of a finished multilayer organic stackup; (C) antennae structures connected to the multilayer organic stackup using dielectric wiring; and (D) printed antennae structures fabricated on preformed dielectric lids or caps. Each of these antennae structures will now be described in more detail with respect to FIGS. 2-6.

A. Antenna Structures Provided on One or More Sides of a Multilayer Stackup

FIG. 2A illustrates a perspective view of a multilayer substrate 200 in accordance with an example embodiment of the invention. The multilayer substrate 200 may include a plurality of interior and/or exterior metallization/conductive layers, including a metallization/conductive layer on an outer surface of the substrate 200. The outer metallization/conductive layer may be patterned to form pads or other electrical connections for wirebonded Integrated Circuits (ICs) or devices 203, surface mount devices 204, or yet other devices such as flip-chip, wafer level packages (WLP), chip scale packages (CSP), and ball grid array (BOA) devices. The multilayer substrate 200 may also include edge connections 201 that provide an electrical feed or connection to the 3D antennae structures 202 that are defined one or more sides the substrate 200. It will be appreciated that the edge connections 201 may be vias or plated through holes. According to an embodiment of the invention, the antennae structures 202 may be provided on two or more sides of a multilayer organic stackup 200. Each of at least two sides of a multilayer stackup 200 can be represented by a different antennae structure 202, where each antenna structure 202 can operate at a different frequency or band of frequencies. Although meander antennae structures 202 are illustrated in FIG. 2A, it will be appreciated that other antennae structures could also be realized without departing from example embodiments of the invention.

Still referring to FIG. 2A, the antennae structures 202 may be comprised of a plurality of metallization/conductive layers or traces 202a-d formed on respective organic layers (e.g., in the X-Y plane) and interconnected using one or more buried vias or plated though holes 202e-g (in the Z-axis). According to an example embodiment of the invention, the buried vias or plated through holes 202e-g may be filled with various materials, including one or more of metals, magnetic materials, dielectrics, tunable ceramics, BST ($Ba_{1-x}Sr_xTiO_3$) type materials, resistive materials, and the like to provide the desired tunability, bandwidth, and/or performance of the antenna.

During fabrication of the multilayer stackup 200, the antennae structures 202 may be fabricated using standard fabrication techniques known to those of ordinary skill in the art, including print and etch techniques. Performance of the antennae structures 202 can be controlled by the conductor metal thickness of the metallization/conductive layers or traces 202a-d and/or the fillers used with the buried vias or plated through holes 202e-g. Further, performance of the antennae structures 202 may further be controlled by adjusting the dielectric thickness, dielectric constant, and dielectric loss of the organic layers that comprise the multilayer stackup. According to another embodiment of the invention, the antenna structure 202 may also be provided within a resonant cavity to improve the performance of the antenna structure 202. Therefore, these antennae structures 202, which are formed of the metallization/conductive layers or traces 202a-d and buried vias or plated through holes 202e-g, may be fabricated and/or tuned during the actual build-up of the circuitry of the multilayer substrate 200.

The antennae structures 202 may then be revealed during a singulation process to yield each completed multilayer substrate 200 (e.g., a completed module). Indeed, once the module circuitry is completed and the wirebonded devices 203 and surface mount devices 204 are assembled, the singulation process may be performed using dicing fidicials to ensure accurate dicing along a module edge, thereby exposing the metal of the antennae structure 202. However, it will be appreciated that in some embodiments, the antennae structures 202 may be completely or partially hidden/unexposed within the multi-layer stackup 200, which may allow for size reduction of the antennae structures 202.

FIG. 2B illustrates a front view of the multilayer substrate 200, according to an example embodiment of the invention. As more particularly shown in FIG. 2B, the multilayer substrate 200 may include a plurality of organic layers such as organic layers 205a-e. The organic layers 205a-e may be formed of thermoplastic or thermoset materials, including Rogers 4350 or Rogers 4003, liquid crystalline polymer (LCP), polyphenyl ether (PPE), hydrocarbon, Teflon, epoxy, polyamide, polyimide, and acryllate. As described above, the metallization/conductive layers or traces 202a-c of the antennae structures 202 may be provided on or between respective organic layers 205a-e. These metallization/conductive layers or traces 202a-d may then be interconnected using the buried microvias or plated through holes 202e-g. For example, metallization/conductive layer or trace 202a (sandwiched between organic layers 205a and 205b) may be electrically connected to the metallization/conductive layer or trace 202d (sandwiched between organic layers 205d and 205e) using buried microvia or plated through hole 202e. Similarly, metallization/conductive layer or trace 202b (sandwiched between organic layers 205b and 205c) may be electrically connected to the metallization/conductive layer or trace 202d (sandwiched between organic layers 205d and 205e) using buried microvia or plated through hole 202f. Finally, metallization/conductive layer or trace 202b (sandwiched between organic layers 205b and 205c) may be electrically connected to the metallization/conductive layer or trace 202c (sandwiched between organic layers 205c and 205d) using buried microvia or plated through hole 202g. While the above configuration has been provided for illustrative purposes, it will be appreciated that other configurations for antennae structures are available without departing from embodiments of the invention.

B. Antennae Structures Printed Directly on the Top of a Finished Multilayer Organic Stackup FIG. 3A illustrates a perspective view of an encapsulated module while FIG. 3B illustrates a cross-sectional view of the an encapsulated module of FIG. 3A, according to an example embodiment of the invention. More specifically, as shown in FIGS. 3A and 3B, the multi-layer stackup 200 of FIGS. 2A and 2B has been provided with an overmold, premold, or molded cap 305. It will be appreciated that the overmold, premold, or molded cap 305 may be formed of an organic materials described herein, including thermoplastic materials. The overmold, premold, or molded cap 305 may encapsulate the wirebonded ICs or devices 203 and surface mount devices 204 that are adjacent to an outer surface of the multilayer stackup 200. In addition to the antennae structures 202 on the sides of the multi-layer stackup 200, one or more antennae structures 306 may be provided on a top surface of the overmold 305. The antennae structure 306 may be printed directly on the overmold, premold, or molded cap 105 and fed via traces 307 that interconnect to the multilayer stackup 200 via a conductive seal band 308 that sits on the stackup 200. Although the antennae structure 306 has been illustrated in FIG. 3A as a meander antenna structure, it will be appreciated that other antennae structures could also be realized without departing from embodiments of the invention.

According to an example embodiment of the invention, the antenna structure 306 may effectively service a different frequency from that of antenna structure(s) 202. The servicing of different frequencies may support implementations of frequency diversity and spatial diversity based applications such as 802.11n (MIMO) WLAN. Indeed, the coils of the antennae structures 202 and 306 may be positioned such that the radiated field can be oriented in the desired directions, thereby providing for an excellent spatially diverse solution.

C. Antennae Structures Connected to the Multilayer Organic Stackup Using Dielectric Wiring FIG. 4A illustrates a general overview of an RF module 407 in communication with an antenna structure 409 using a flexible interconnect 408, according to an example embodiment of the invention. The general configuration of FIG. 4A may be utilized for applications that need multiple feeds for multiple very high performing antennas. For example, an antenna array may require various control lines in addition to RF lines. Additionally, applications such ultra mobile PCs (UMPCs), cellular phones, and the like may require RF modules with antennas that can be conformed to the plastic housing for those devices. Other applications will be apparent to those of ordinary skill in the art.

Generally, the flexible interconnect 408 of FIG. 4A may be fabricated from flexible organic materials similar or identical to those that are used in realizing the RF module 407 and/or the antenna structure or module 409, including thermoplastic materials. According to an example embodiment of the invention, the flexible interconnect 408 can be part of the circuitry that was used in fabricating the RF module 407. Alternatively, the flexible interconnect 408 may be a stand-alone flexible interconnect 408 that is capable of being impedance matched to the RF module 407 and the antenna structure or module 409. The stand-alone flexible interconnect 408 can then be electrically connected to a surface (e.g., top, bottom) of the RF module 407 and antenna structure or module 409 using a variety of methods, including interconnects, land grid arrays (LGAs), ball grid arrays (BGAs), vias and plated through holes, and the like.

According to an embodiment of the invention, the flexible interconnect 408 may be fabricated using one or more organic layers having at least one metallization/conductive layer or trace. A metallization/conductive layer or trace may be formed on a top and/or bottom surface of the organic layer. Alternatively or additionally, the metallization/conductive layer or trace may be sandwiched between organic layers and accessed by the RF module 407 or antenna structure or module 409 using at least one via or plated through hole. The metallization/conductive layers or traces may provide one or more distinct electrical paths in accordance with the desired connectivity between the RF module 407, the antenna structure or module 409, and associated devices FIG. 4B illustrates an embodiment of the invention where a flexible interconnect 410 connecting the RF module 407 and the antenna structure or module 409 is fabricated as part of the actual circuitry of the RF module 407. The embodiment of FIG. 4B may be utilized for applications that are not only space constrained but that also need super thin front-end modules. In FIG. 4B, the flexible interconnect 410 may be part of a rigid flex construction. All of the matching components for the flexible interconnect 410 may be fabricated at the same time as the embedded passive components are fabricated for the RF module 407. These embedded and matching components may include inductors, capacitors, filters, baluns, diplexers, multiplexers, and yet others described in U.S. Pat. No. 6,900,708; U.S. Pat. No. 7,068,124; and U.S. application Ser. No. 11/177,508, which can be implemented without the need for rigid cores on either side. According to an embodiment of the invention, a complete CPW type implementation may be utilized to form inductors and capacitors with neighboring ground that is connected to the system ground using the flex connections, thereby allowing the antenna structure or module 409 to be in areas where there is no ground. Once the flexible interconnect 410 has been fabricated, it can be electrically connected to the antenna structure or module 409 using interconnects, land grid arrays (LGAs), ball grid arrays (BGAs), vias and plated through holes, and the like.

FIG. 4C illustrates an example embodiment of the invention where the flexible interconnect 412 can serve as the substrate upon which the actual antenna structure 413 is fabricated. In FIG. 4C, the flexible interconnect 412 may be both moldable and conformal. The antenna structure 413 may be printed on a surface of the flexible interconnect 412. Additionally, a ground connection may be provided on an opposite surface of the flexible interconnect 412. According to an alternative embodiment of the invention, the ground connection and the antenna structure 413 may be positioned on the same surface of the flexible interconnect 412. It will be appreciated that the flexible interconnect 412 may also include at least one via or plated through hole for electrically connecting the antenna structure 413 to the one or more metallization/conductive layers or traces of the flexible interconnect 412 to provide an electrical connectivity to the devices within the RF module 407.

The process for fabricating such a flexible interconnect of FIG. 4C is illustrated in FIGS. 5A and 5B. In particular, FIG. 5A illustrates organic layers 501, 502, and 503 with embedded components fabricated on one or more metallization layers supported by the organic layers 501, 502, and 503. In FIG. 5B, portions of the organic layers 501 and 503 are removed using any of a variety of mechanical/laser/plasma removal processes and yet other processes known to those of ordinary skill in the art. As shown in FIG. 5B, the RF module 504 remains along with the flexible interconnect 506. In addition to being in electrical communication with the RF module 504, the flexible interconnect 506 may also be in electrical communication with the antenna structure 508, as described below with respect to FIGS. 5C and 5D. Additionally, the flexible interconnect 506 may also include passive (e.g., dual-plate capacitors, inductors, etc.) or active devices (amplifiers, switches, etc.) on one or more surfaces of the flexible interconnect 506. According to one embodiment of the invention, these devices may be used for matching the antenna structure 508. According to another embodiment, active devices such as amplifiers and switches may be utilized to enable switchability/configurability for the antenna structure(s) 508 or to otherwise lower transmission losses by bringing the amplifiers closer to the antenna structure 508.

FIGS. 5C and 5D illustrate example embodiments of providing electrical connections between the antenna structure 508 and the RF module 504 using the flexible interconnect 506. In FIG. 5C, the antennae structure 508 may be electrically connected to a metallization/conductive layer or trace 510 formed on a top surface of the flexible interconnect 510/organic layer 502. The metallization/conductive layer or trace 510 can then electrically connect to one or more devices within the RF module 504. Optionally, one or more vias 514 may be provided for interlayer connections with another metallization/conductive layer or trace 512 within the RE module 504. Additionally, a cover layer 511, which may be an organic cover layer, may also be positioned opposite the exposed organic layer 502 such that the resulting two organic layers 502 and 511 of the flexible interconnect 506 sandwich the metallization/conductive layer or trace 512.

FIG. 5D is one of a plurality of alternatives to FIG. 5C. In FIG. 5D, at least one via 516 is provided to interconnect the antenna structure 508 with a metallization/conductive layer or trace 518 formed on an opposite side of the flexible interconnect 506/organic layer 502. The metallization/conductive layer or trace 518 can then electrically connect to one or more devices within the RF module 504. Optionally, one or more vias 520 may be provided for interlayer connections with another metallization/conductive layer or trace 522. Additionally, a cover layer, which may be an organic cover layer 519, may also be positioned opposite the exposed organic layer 502 such that the resulting two organic layers 502 and 519 of the flexible interconnect 506 sandwich the metallization/conductive layer or trace 522. It will be appreciated that many other configurations other than those shown in FIGS. 5C and 5D are available, according to alternative example embodiments of the invention.

Referring back to FIG. 4D, there is illustrated another embodiment of the invention in which a flexible interconnect 412 can be electrically connected to the bottom of the RF module 407. More specifically, the flexible interconnect 412 may include an antenna structure 413 fabricated on a surface (e.g., a top surface, etc.) of the flexible interconnect 412 or otherwise be in electrical contact with the flexible interconnect 412 by way of the one or more metallization/conductive layers or traces of the interconnect 412. With the antenna structure 413 at one end of the flexible interconnect 412, the opposite end of the flexible interconnect 412 may be attached to the a surface of the RF module 407 (e.g., a bottom surface, etc.). A variety of methods may be used to attach the flexible interconnect 412 to a surface of the RF module 407 including land grid arrays (LGAs), pin grid arrays (PGAs), ball grid arrays (BGAs), electrical pads such as I/O pads, vias or plated through holes, conductive adhesives, and the like.

FIGS. 4E and 4F illustrate example embodiments of the invention where a length of the flexible interconnect 412 may be adjusted in order to achieve the desired separation distance between the antenna structure 413 and the ground reference plane 418 to minimize coupling. In FIG. 4E, the flexible interconnect 412, which is fabricated as part of the actual circuitry of the RF module 407, may be adjusted in length and/or flexibly conformed to vary the separation distance between the antenna structure 413 and the ground reference plane 418. Likewise, in FIG. 4F, wherein the flexible interconnect, which is fabricated separately from the RF module 407 and subsequently attached to the RF module 407, may also be adjusted in length and/or flexibly conformed to vary the separation distance between the antenna structure 413 and the ground reference plane 418. According to an example embodiment of the invention, it will be appreciated that an ultra mobile PC (UMPC), cellular phone, or similar type of application may utilize antennae structures 413 with flexible interconnects 412, as illustrated in FIGS. 4E and 4F. It will also be appreciated that while the flexible interconnect 412 has been illustrated in FIGS. 4E and 4F as being conformed in a particular manner, it will be appreciated that other flexible interconnects can be conformed in other directions or in other manners (e.g., multiple arcs).

FIG. 4G illustrates an example embodiment of the invention where a flexible interconnect 424 may be used to form a canopy structure over the RF module 423 in a similar fashion as to a TAB connection. According to this embodiment, the antennae structures 427 may be formed on a surface of the flexible interconnect 424. The ends of the flexible interconnect 427 may be attached to a bottom surface of the RF module 423 using a land grid array (LGA) connection 425 or similar electrical pad connection, including a BGA, a PGA, vias and plated through holes, and the like. According to an example embodiment of the invention, the flexible interconnect 427 may be connected using LGA connections 425. In addition, the bottom surface of the RF module 423 may also include ball grid array (BGA) connections 426 or additional LGA connections 425. The BGA connections 426 or additional LGA connections 425 provide the second level interconnections between the RF module 423 and the printed circuit board during final assembly.

D. Printed Antennae Structures Fabricated on Preformed Dielectric Lids or Caps

Referring to FIG. 6, an antenna structure 620 may be printed on a preformed dielectric cap or lid 621. The dielectric cap or lid 621 may be comprised of one or more organic materials described herein. According to an example embodiment of the invention, the dielectric cap or lid 621 may be a premolded cap or a molded cap. According to an example embodiment of the invention, the dielectric cap or lid 621 may be coated with one or more metals such as Cu, Ni, Au, Ag and then etched or otherwise selectively removed (e.g., patterned) to form an antenna structure 620. The cap or lid 621 may mounted onto the RF module 622 and electrically connected along the edges of the metal etched cap or lid 621 by way of solder, conductive adhesive, and/or surface mount (SMT) pads or other pads fabricated on the top surface of the RF module 622. By controlling the height of the preformed cap or lid 621, one can control the separation distance from the ground plane which, in this embodiment can reside on the top surface of the RF module 622. It will also be appreciated that the RF module 622 may also include BGA connections 627 or LGA connections 626 for second level interconnections between the RF module 622 and the printed circuit board during final assembly. It will be appreciated that other connections are available in addition to BGA and LGA connections, including PGA connections and the like.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A system for an organic antenna structure, comprising:
a first organic layer having a first portion and a second portion, the first portion including a first conductive layer that is patterned to form at least one passive device and the second portion including a second conductive layer that is patterned to form one or more interconnect traces, wherein the first conductive layer and the second conductive layer are electrically connected;
a second organic layer positioned over the first portion of the first organic layer, wherein the second organic layer and the first portion of the first organic layer sandwich the first conductive layer, and further wherein the second organic layer is not positioned over a substantial part of the second portion of the first organic layer; and
an antenna structure, wherein the antenna structure is electrically connected to one or more interconnect traces of the second conductive layer.

2. The system of claim 1, wherein the second organic layer and the first portion of the first organic layer form a module, wherein the second portion of the first organic layer forms a flexible interconnect between the module and the antenna structure.

3. The system of claim 1, further comprising a third organic cover layer positioned over the second portion of the first organic layer, wherein the third organic cover layer and the second portion of the first organic layer sandwiches the second conductive layer.

4. The system of claim 1, wherein the first organic layer is comprised of a thermoplastic material.

5. The system of claim 4, wherein the thermoplastic material includes polyimide, polyamide, acryllate, or liquid crystalline polymer (LCP).

6. The system of claim 1, wherein the antenna structure is positioned on a first surface of the second portion of the first organic layer.

7. The system of claim 6, wherein a reference ground plane is positioned on a second surface opposite the first surface of the second portion of the first organic layer.

8. A system for organic antenna structures, comprising:
a multilayer organic stackup, wherein the stackup includes:
a first organic layer having a conductive layer, wherein the conductive layer is patterned to form at least one passive device; and
a second organic layer positioned opposite the first organic layer, wherein the first and second organic layers sandwich the patterned conductive layer;
an antenna structure distinct and separate from the multilayer stackup; and
a flexible organic interconnect that electrically connects at least a portion of the conductive layer of the multilayer organic stackup and the antenna structure.

9. The system of claim 8, wherein the flexible organic interconnect is comprised of a thermoplastic material.

10. The system of claim 9, wherein the thermoplastic material includes polyimide, polyamide, acryllate, or liquid crystalline polymer (LCP).

11. The system of claim 8, wherein the flexible organic interconnect comprises a second dielectric layer, an organic cover layer, and a metallization layer disposed between the second dielectric layer and the organic cover layer.

12. The system of claim 11, further comprising at least one via that electrically connects the antenna structure to the metallization layer of the flexible organic interconnect.

13. The system of claim 8, wherein the antenna structure is formed on a first surface of the flexible organic interconnect.

14. The system of claim 13, wherein a reference ground plane is formed on a second surface opposite the first surface of the flexible organic interconnect.

15. A multilayer stackup, comprising:
a first organic layer having a first conductive layer adjacent to a first surface and a second conductive layer adjacent to a second surface opposite the first surface, wherein the first and second conductive layers are patterned to form at least one passive device and first parallel sections of an antenna structure;
a second organic layer positioned opposite the first surface of the first organic layer;
a third organic layer positioned opposite the second surface of the first organic layer, wherein the second and third organic layers sandwich the first organic layer; and
at least one first via originating at the first conductive layer and terminating at the second layer to electrically connect the first parallel sections of the antenna structure.

16. The multi-layer stackup of claim 15, wherein the at least one first via includes fillers for tuning a performance of the antenna structure.

17. The multi-layer stackup of claim 15, wherein one or both of the second or third organic layer includes a third conductive layer, wherein the third conductive layer is patterned to form a second parallel section of the antenna structure, and further comprising at least one second via electrically connecting the second parallel section to the first parallel sections of the antenna structure.

18. The multi-layer stackup of claim 15, wherein the first, second, and third organic layers share a first side surface, wherein the antenna structure is exposed at the first side surface.

19. The multi-layer stackup of claim 18, further comprising a plated through hole formed along the first side surface, wherein the antenna structure is electrically connected to the first side surface.

20. The multi-layer stackup of claim 15, wherein the first, second, and third organic layers comprise liquid crystalline polymer (LCP).

21. The multi-layer stackup of claim 15, further comprising an organic encapsulate or lid on an exterior surface of the second organic layer or the third organic layer, wherein the encapsulate or lid includes a second antenna structure.

* * * * *